US010756693B1

United States Patent
Shang et al.

(10) Patent No.: US 10,756,693 B1
(45) Date of Patent: Aug. 25, 2020

(54) INTEGRATED CIRCUIT DEVICE

(71) Applicant: NANYA TECHNOLOGY CORPORATION, New Taipei (TW)

(72) Inventors: Kai-Po Shang, Taichung (TW); Jui-Hsiu Jao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/596,749

(22) Filed: Oct. 8, 2019

(51) Int. Cl.
*H03H 7/00* (2006.01)
*H01L 23/64* (2006.01)

(52) U.S. Cl.
CPC ............ *H03H 7/004* (2013.01); *H01L 23/642* (2013.01)

(58) Field of Classification Search
CPC ............................ H03H 7/004; H01L 23/642
USPC ........................................................ 327/365
See application file for complete search history.

(56) References Cited

U.S. PATENT DOCUMENTS

| 5,889,679 A | 3/1999 | Henry et al. |
| 9,944,981 B2 | 4/2018 | Rothberg et al. |
| 2010/0271140 A1* | 10/2010 | Raghunathan .......... H03L 7/099 331/34 |
| 2015/0049561 A1* | 2/2015 | Shin ........................ G11C 5/143 365/189.011 |
| 2017/0053932 A1* | 2/2017 | Jeon .................. H01L 27/11582 |

FOREIGN PATENT DOCUMENTS

TW 201133796 A1 10/2011

* cited by examiner

*Primary Examiner* — Tomi Skibinski
(74) *Attorney, Agent, or Firm* — CKC & Partners Co., LLC

(57) ABSTRACT

An integrated circuit device is disclosed. The integrated circuit device includes a capacitor array, a decoder circuit, and an integrated circuit. The capacitor array includes a plurality of capacitor units. The decoder circuit is coupled to the capacitor array. The integrated circuit is coupled to the decoder circuit. The decoder circuit is configured to conduct part of the plurality of capacitor units, and to un-conduct part of the plurality of capacitor units, so as to adjust a capacitance value coupled to the integrated circuit.

9 Claims, 2 Drawing Sheets

INTEGRATED CIRCUIT DEVICE

BACKGROUND

Technical Field

The present disclosure relates to an integrated circuit device. More particularly, the present disclosure relates to an integrated circuit device with several capacitors and integrated circuits.

Description of Related Art

In some particular purposes, capacitors are used as a bridge between IC (Integrated Circuit) and outer circuits such as Power Supply, I/O pin, etc. For example, a decoupling capacitor is connected to the IC in order to lower the noise effect and stabilize the signals. However, present circuit design usually combines one or more capacitors by the side of a corresponding IC, and it consumes relatively more area.

SUMMARY

An integrated circuit includes a capacitor array, a decoder circuit, and an integrated circuit. The capacitor array includes a plurality of capacitor units. The decoder circuit is coupled to the capacitor array. The integrated circuit is coupled to the decoder circuit. The decoder circuit is configured to conduct part of the plurality of capacitor units, and to un-conduct part of the plurality of capacitor units, so as to adjust a capacitance value coupled to the integrated circuit.

In sum, by using the capacitor array structure, the capacitance may be tuned by the decoder to connect to the corresponding IC whenever necessary, which is more flexible for different situation. Furthermore, by putting all the capacitors together, we can save the area by the side of the corresponding integrated circuit.

BRIEF DESCRIPTION OF THE DRAWINGS

The present disclosure can be more fully understood by reading the following detailed description of the embodiment, with reference made to the accompanying drawings as follows.

DETAILED DESCRIPTION

In order to make the description of the disclosure more detailed and comprehensive, reference will now be made in detail to the accompanying drawings and the following embodiments. However, the provided embodiments are not used to limit the ranges covered by the present disclosure; orders of step description are not used to limit the execution sequence either. Any devices with equivalent effect through rearrangement are also covered by the present disclosure.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

In this document, the term "coupled" may also be termed as "electrically coupled," and the term "connected" may be termed as "electrically connected." "Coupled" and "connected" may also be used to indicate that two or more elements cooperate or interact with each other.

Figure 1:
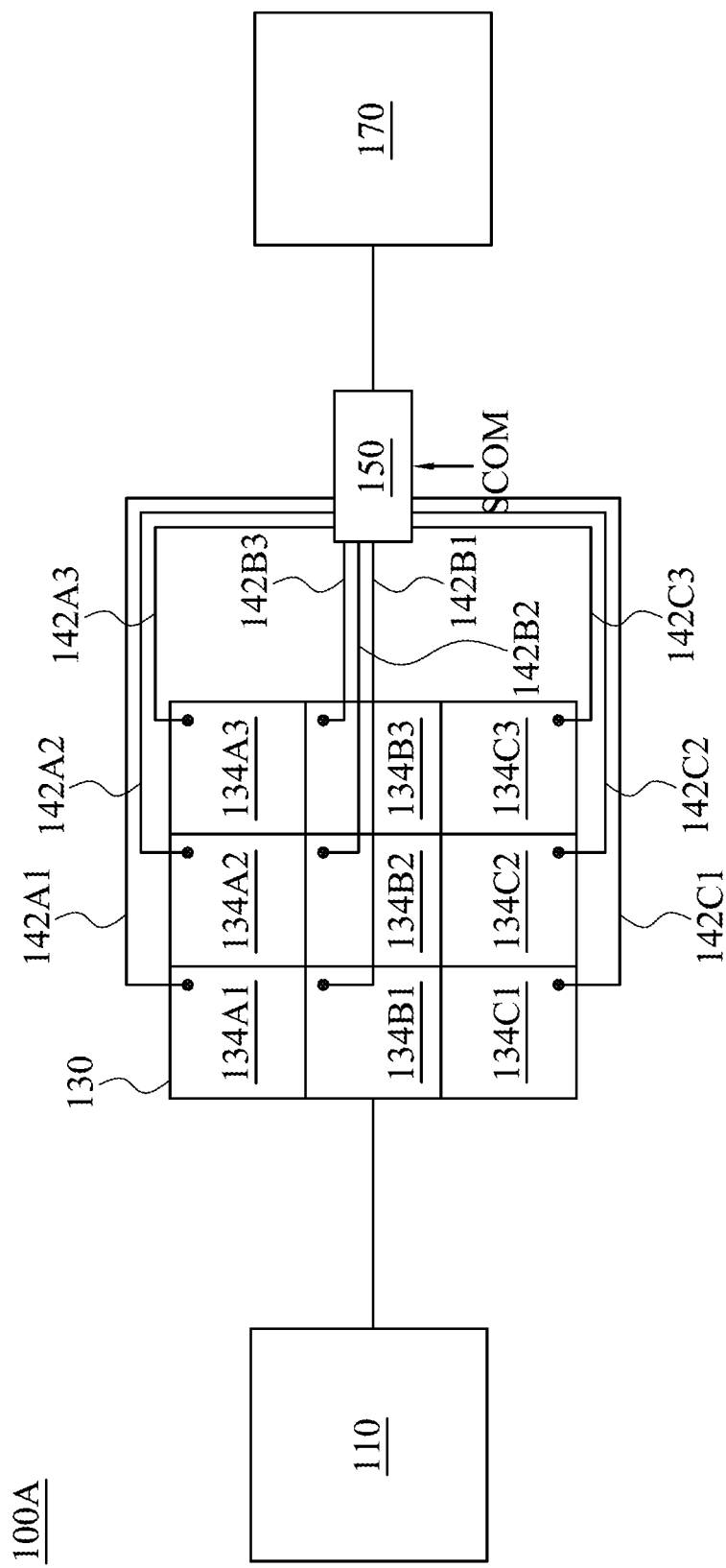
FIG. 1 is a schematic diagram of an integrated circuit device according to some embodiments of the present disclosure.

Reference is made to FIG. 1. FIG. 1 is a schematic diagram of an integrated circuit device 100A according to some embodiments of the present disclosure. The integrated circuit device 100A includes a capacitor array 130, a decoder circuit 150, and an integrated circuit 170. In some embodiments, the decoder circuit 150 is coupled to the capacitor array 130. The integrated circuit 170 is coupled to the decoder circuit 150. Moreover, the capacitor array 130 includes several capacitor units 134A1 to 134A3, 134B1 to 134B3, and 134C1 to 134C3. In some embodiments, the capacitor units may be formed of materials conventionally used to form capacitors.

In the operation relationship, the decoder circuit 150 is configured to conduct part of the capacitor units 134A1 to 134A3, 134B1 to 134B3, and 134C1 to 134C3. The decoder circuit 150 is also configured to un-conduct part of the capacitor units 134A1 to 134A3, 134B1 to 134B3, and 134C1 to 134C3, so as to adjust the capacitance value coupled to the integrated circuit 170.

As illustrated in FIG. 1, in some embodiments, the capacitor units 134A1 to 134A3, 134B1 to 134B3, and 134C1 to 134C3 are coupled to the decoder circuit 150 through several metal wires 142A1 to 142A3, 142B1 to 142B3, and 142C1 to 142C3.

In detail, the capacitor unit 134A1 is coupled to the decoder circuit 150 through the metal wires 142A1, the capacitor unit 134A2 is coupled to the decoder circuit 150 through the metal wires 142A2, the capacitor unit 134A3 is coupled to the decoder circuit 150 through the metal wires 142A3, the capacitor unit 134B1 is coupled to the decoder circuit 150 through the metal wires 142B1, the capacitor unit 134B2 is coupled to the decoder circuit 150 through the metal wires 142B2, the capacitor unit 134B3 is coupled to the decoder circuit 150 through the metal wires 142B3, the capacitor unit 134C1 is coupled to the decoder circuit 150 through the metal wires 142C1, the capacitor unit 134C2 is coupled to the decoder circuit 150 through the metal wires 142C2, and the capacitor unit 134C3 is coupled to the decoder circuit 150 through the metal wires 142C3.

In some embodiments, the decoder circuit 150 determines whether each of the metal wires 142A1 to 142A3, 142B1 to 142B3, and 142C1 to 142C3 is conducted or un-conducted, so as to adjust the capacitance value of the capacitor array 130.

In some embodiments, the decoder circuit 150 adjusts the capacitance value of the capacitor array 130 by conducting part of the capacitor units 134A1 to 134A3, 134B1 to 134B3, and 134C1 to 134C3 and un-conducting part of the capacitor units 134A1 to 134A3, 134B1 to 134B3, and 134C1 to 134C3. The capacitor units 134A1 to 134A3, 134B1 to 134B3, and 134C1 to 134C3 may be connected in series or in parallel, depending on the control of the decoder circuit 150.

In some embodiments, the decoder circuit 150 receives a command SCOM and determines whether each of the plurality of metal wires 142A1 to 142A3, 142B1 to 142B3, and 142C1 to 142C3 is conducted or un-conducted according to the command SCOM.

In some embodiments, the capacitor units 134A1 to 134A3, 134B1 to 134B3, and 134C1 to 134C3 are configured to be decoupling capacitor units. A decoupling capacitor (also called bypass capacitor) is a capacitor used to decouple one part of an electrical network (circuit) from another. Noise caused by other circuit elements is shunted through the capacitor, reducing the effect it has on the rest of the circuit.

As illustrated in FIG. 1, in some embodiments, the integrated circuit device 100A includes a power supply circuit 110. The power supply circuit 110 is coupled to the capacitor array 130. The capacitor array 130 is configured to transmit a signal to the integrated circuit 170 through the capacitor array 130. In some embodiments, the signal may be a power signal, an I/O signal, and so on.

Figure 2:
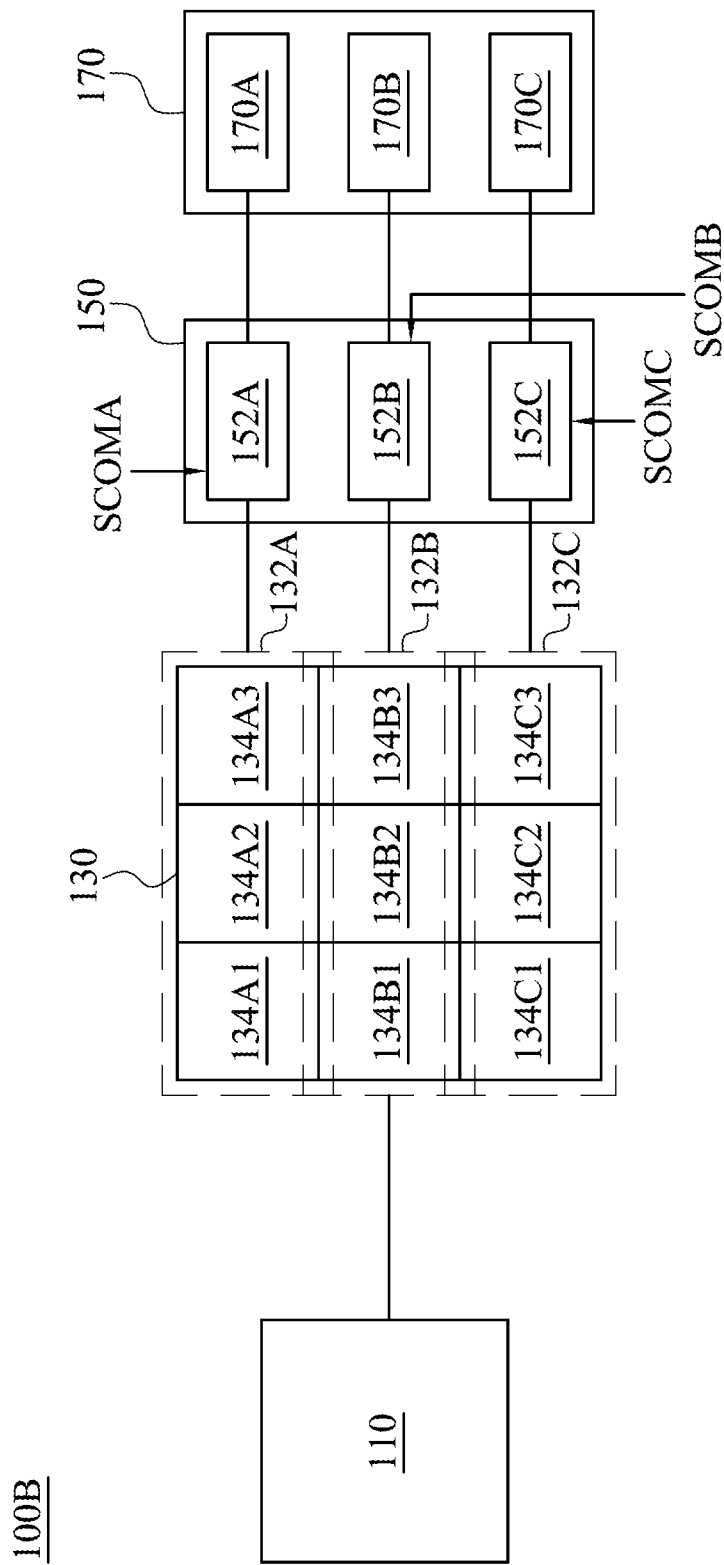
FIG. 2 is a schematic diagram of another integrated circuit device according to some embodiments of the present disclosure.

Reference is made to FIG. 2. FIG. 2 is a schematic diagram of another integrated circuit device 100B according to some embodiments of the present disclosure. As illustrated in FIG. 2, the integrated circuit 170 includes several sub-integrated circuits 170A to 170C, and the capacitor array 130 includes several capacitor groups 132A to 132C. Each of the sub-integrated circuits 170A to 170C correspond to one of the capacitor groups 132A to 132C. In detail, the sub-integrated circuit 170A corresponds to the capacitor group 132A, the sub-integrated circuit 170B corresponds to the capacitor group 132B, and the sub-integrated circuit 170C corresponds to the capacitor group 132C.

In some embodiments, the capacitor groups 132A to 132C are independent to each other.

In some embodiments, the decoder circuit 150 includes several sub-decoder circuits 152A to 152C. Each of the sub-decoder circuits 152A to 152C is connected between one of the sub-integrated circuits 170A to 170C and one of the capacitor groups 132A to 132C. In detail, the sub-decoder circuit 152A is connected between the sub-integrated circuit 170A and the capacitor group 132A, the sub-decoder circuit 152B is connected between the sub-integrated circuit 170B and the capacitor group 132B, and the sub-decoder circuit 152C is connected between the sub-integrated circuit 170C and the capacitor group 132C.

As illustrated in FIG. 2, the capacitor group 132A includes capacitor units 134A1 to 134A3, the capacitor group 132B includes capacitor units 134B1 to 134B3, and the capacitor group 132C includes capacitor units 134C1 to 134C3. It should be noted that, the shape of the capacitor groups 132A to 132C or the number of the capacitor units included in the capacitor groups 132A to 132C are for illustrative purposes only, and the embodiments of the present disclosure are not limited thereto. Furthermore, in some embodiments, the capacitor array 130 may be a three-dimensional array or a two-dimensional array.

The sub-decoder circuit 152A adjusts the capacitance value of the capacitor group 132A, the sub-decoder circuit 152B adjusts the capacitance value of the capacitor group 132B, and the sub-decoder circuit 152C adjusts the capacitance value of the capacitor group 132C.

In some embodiments, the sub-decoder circuit 152A adjusts the capacitance value of the capacitor group 132A according to the command SCOMA, the sub-decoder circuit 152B adjusts the capacitance value of the capacitor group 132B according to the command SCOMB, and the sub-decoder circuit 152C adjusts the capacitance value of the capacitor group 132C according to the command SCOMC.

According to the integrated circuit devices 100A and 100B mentioning above, by using the capacitor array, the capacitance value to connect to the corresponding integrated circuit may be tuned whenever necessary. Furthermore, by putting all the capacitor units together, the area by the side of the corresponding integrated circuit may be saved, and the area may be utilized more effectively.

Although the present disclosure has been described in considerable detail with reference to certain embodiments thereof, other embodiments are possible. Therefore, the spirit and scope of the appended claims should not be limited to the description of the embodiments contained herein.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. An integrated circuit device, comprising:
    a capacitor array, comprising a plurality of capacitor units;
    a decoder circuit, coupled to the capacitor array; and
    an integrated circuit, coupled to the decoder circuit,
    wherein the decoder circuit is configured to conduct part of the plurality of capacitor units, and to un-conduct part of the plurality of capacitor units, so as to adjust a capacitance value coupled to the integrated circuit;
    wherein the integrated circuit comprises a plurality of sub-integrated circuits, and the capacitor array comprises a plurality of capacitor groups, wherein each of the plurality of sub-integrated circuits corresponds to one of the plurality of capacitor groups.

2. The integrated circuit device of claim 1, wherein the plurality of capacitor units are coupled to the decoder circuit through a plurality of metal wires.

3. The integrated circuit device of claim 2, wherein the plurality of capacitor units are configured to be a plurality of decoupling capacitor units.

4. The integrated circuit device of claim 2, wherein the decoder circuit determines whether each of the plurality of metal wires is conducted or un-conducted.

5. The integrated circuit device of claim 4, wherein the decoder circuit receives a command and determines whether each of the plurality of metal wires is conducted or un-conducted according to the command.

6. The integrated circuit device of claim 1, wherein the plurality of capacitor groups are independent to each other.

7. The integrated circuit device of claim 1, wherein the decoder circuit comprises a plurality of sub-decoder circuits, wherein each of the sub-decoder circuits is connected between one of the plurality of sub-integrated circuits and one of the plurality of capacitor groups.

8. The integrated circuit device of claim 1, wherein the capacitor array is a three-dimensional array.

9. The integrated circuit device of claim 1, further comprises:

a power supply circuit, coupled to the capacitor array, configured to transmit a signal to the integrated circuit through the capacitor array.

* * * * *